United States Patent
Sim et al.

(10) Patent No.: US 12,360,154 B2
(45) Date of Patent: Jul. 15, 2025

(54) WIRELESS CHANNEL REPRODUCTION DEVICE

(71) Applicant: Electronics and Telecommunications Research Institute, Daejeon (KR)

(72) Inventors: Dong-Uk Sim, Daejeon (KR); Sangil Kwak, Daejeon (KR); Seung Keun Park, Daejeon (KR); Hyeyeon Kwon, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 321 days.

(21) Appl. No.: 18/120,213

(22) Filed: Mar. 10, 2023

(65) Prior Publication Data
US 2023/0384360 A1    Nov. 30, 2023

(30) Foreign Application Priority Data

May 27, 2022  (KR) .................. 10-2022-0065181
Nov. 11, 2022  (KR) .................. 10-2022-0150421

(51) Int. Cl.
  *G01R 31/28*  (2006.01)
  *H04B 17/00*  (2015.01)

(52) U.S. Cl.
  CPC ..... *G01R 31/2822* (2013.01); *H04B 17/0085* (2013.01)

(58) Field of Classification Search
  None
  See application file for complete search history.

(56) References Cited

U.S. PATENT DOCUMENTS

| | | |
|---|---|---|
| 2013/0050006 A1 | 2/2013 | Sim |
| 2014/0338471 A1* | 11/2014 | Sayler ............... G01N 21/8806 29/401.1 |
| 2016/0131689 A1* | 5/2016 | Monsef ............ G01R 29/0821 324/750.14 |
| 2018/0231593 A1* | 8/2018 | Sim .................. G01R 29/0821 |
| 2019/0221948 A1* | 7/2019 | Ramirez ................. H01Q 9/30 |

(Continued)

FOREIGN PATENT DOCUMENTS

| | | |
|---|---|---|
| JP | 2010-156572 | 7/2010 |
| KR | 10-2018-0093176 | 8/2018 |
| KR | 10-2019-0058143 | 5/2019 |

(Continued)

OTHER PUBLICATIONS

CTIA, Version: 1.2.1, Feb. 2019, Test Plan for Wireless Large-Form-Factor Device Over-the-Air Performance.

(Continued)

*Primary Examiner* — Wilson Lee
(74) *Attorney, Agent, or Firm* — KILE PARK REED & HOUTTEMAN PLLC

(57) ABSTRACT

Provided is a wireless channel reproduction device having a structure of an reverberation chamber. More specifically, the wireless channel reproduction device may minimize a measurement uncertainty by satisfying recommendations on spatial uniformity or field uniformity of a working volume and may be designed as an internal structure of an reverberation chamber including a plurality of mode agitators.

16 Claims, 7 Drawing Sheets

(56) References Cited

U.S. PATENT DOCUMENTS

2019/0339315 A1* 11/2019 Sim .................... G01R 29/0821
2022/0196717 A1    6/2022 Malmlof et al.

FOREIGN PATENT DOCUMENTS

KR    10-2019-0126651      11/2019
KR    10-2020-0110370       9/2020

OTHER PUBLICATIONS

IEC 61000-4-21 (International standard "Electromagnetic Compatibility (EMC)—Part 4-21: Testing and measurement techniques—Reverberation chamber test methods"), Jan. 2011.

* cited by examiner

WIRELESS CHANNEL REPRODUCTION DEVICE

CROSS-REFERENCE TO RELATED APPLICATION

This application claims the benefit of Korean Patent Application No. 10-2022-0065181 filed on May 27, 2022, and Korean Patent Application No. 10-2022-0150421 filed on Nov. 11, 2022, in the Korean Intellectual Property Office, the entire disclosures of which are incorporated herein by reference for all purposes.

BACKGROUND

1. Field of the Invention

One or more embodiments relate to a wireless channel reproduction device, and more particularly, to a wireless channel reproduction device having a structure of an reverberation chamber capable of reproducing a wireless channel.

2. Description of the Related Art

Over-The-Air (OTA) relates to antenna performance in a free space of a chamber and under conditions of actual use and indicates an essential index for radio terminals, such as smartphones. In the related art, antenna radiation performance has been measured in an electromagnetic wave anechoic chamber, but recently, the antenna radiation performance has been measured in an reverberation chamber, which is similar to the environment in which a radio terminal is actually used and has advantages in a simple measurement method and a time required.

That is, since the reverberation chamber may reproduce a wireless channel, the reverberation chamber may be used to measure antenna radiation performance of various types of radio terminals, such as cellular support machines, in a terminal development stage. Main evaluation indicators for antenna radiation performance may provide Total Radiated Power (TRP) and Total Isotropic Sensitivity (TIS). In addition, the reverberation chamber may present the following recommendations for reproducing a wireless channel.

First, when an Elements Under Test (EUT) is within a valid test volume, the volume of the EUT should be large enough to contain a largest-sized EUT.

Second, the volume of EUT and other supporting equipment (e.g., radio frequency (RF) absorbers or EUT fixing equipment) should be less than 8% of the total volume of the reverberation chamber.

Third, the boundary of a test space should be at least 0.5λ in the operating frequency of a wall, a mechanical mode agitator, and an antenna.

Fourth, the EUT should be located in a minimum distance R or more from a chamber surface, wherein R should correspond to at least 0.5λ for the frequency band of interest.

Fifth, a floor stand device should be close to the floor of the reverberation chamber by as much as 0.5λ or less.

Sixth, the spatial uniformity of power in the test volume is defined as the standard deviation of a power transfer function at four vertices and the value should be 0.5 dB in the frequency band of interest.

However, the reverberation chamber has disadvantages in that manufacturing is complicated and there is a need for a high level of design to obtain a measurement accuracy in a test environment. Accordingly, an internal structure may need to be designed for providing an excellent performance in the field uniformity or spatial uniformity of the reverberation chamber based on the above recommendations of the reverberation chamber.

SUMMARY

Embodiments generate a plurality of lower cut-off frequencies and thus provide a structure of an reverberation chamber for greater performance of field uniformity or spatial uniformity, according to a test volume in the reverberation chamber.

Embodiments provide a structure of an reverberation chamber that may be miniaturized to be a smaller in size than a previously implemented reverberation chamber, when a test volume is fixed in the reverberation chamber.

Embodiments implement a specific wireless channel in an reverberation chamber and thus provide a structure of the reverberation chamber supporting the stability and accuracy of a device under test.

Technical Solutions

According to an aspect, there is provided a wireless channel reproduction device including a column mode agitator irregularly disposed between a ceiling surface and a floor surface in an internal space of the wireless channel reproduction device, and a wall mode agitator spaced apart by a certain distance based on a central axis of the column mode agitator and disposed parallel to a wall of the wireless channel reproduction device. The column mode agitator may include a plurality of metal panels having different sizes, and the plurality of metal panels may be formed as a plurality of panel groups for generating different lower cut-off frequencies from each other in the wireless channel reproduction device.

In the column mode agitator, parameters of each of the plurality of panel groups may be adjusted, considering natural frequencies of the plurality of panel groups and lower cut-off frequencies generatable by the natural frequencies.

The parameters may include at least one of i) a position disposed between the ceiling surface and the floor surface, ii) a size of a metal panel included in each of the panel groups, and iii) an angle of a metal panel included in each of the panel groups, for the plurality of metal panels included in each of the plurality of panel groups.

In the column mode agitator, the plurality of panel groups is disposed on a same line at a same separation distance, based on the central axis of the column mode agitator.

The plurality of panel groups may be irregularly disposed on the central axis of the column mode agitator by adjusting parameters of the plurality of metal panels included in each of the plurality of panel groups, according to natural frequencies of the plurality of panel groups and lower cut-off frequencies of the plurality of panel groups.

The wall mode agitator may include the plurality of metal panels and is spaced apart on a same line based on a central axis of the wall mode agitator from the wall of the wireless channel reproduction device.

In the wall mode agitator, parameters of each of the plurality of metal panels included in the wall mode agitator may be adjusted, considering natural frequencies by the plurality of metal panels included in the wall mode agitator and lower cut-off frequencies generatable by the natural frequencies.

According to another aspect, there is provided a wireless channel reproduction device including a mode agitator disposed inside the wireless channel reproduction device and including a plurality of metal panels, a motor disposed outside the wireless channel reproduction device and configured to rotate the mode agitator according to a control command of a user, and a conveyor belt configured to connect the mode agitator the motor. The mode agitator may include a column mode agitator irregularly disposed between a ceiling surface and a floor surface in an internal space of the wireless channel reproduction device and a wall mode agitator spaced apart by a certain distance based on a central axis of the column mode agitator and disposed parallel to a wall of the wireless channel reproduction device.

In the mode agitator, at least one of the plurality of metal panels may be connected to the motor, and the motor rotates the at least one metal panel connected to the motor, using the conveyor belt.

The column mode agitator may include a plurality of metal panels having different sizes, and the plurality of metal panels may be formed as a plurality of panel groups for generating different lower cut-off frequencies from each other in the wireless channel reproduction device.

In the column mode agitator, parameters of each of a plurality of panel groups may be adjusted, considering natural frequencies of the plurality of panel groups and lower cut-off frequencies generatable by the natural frequencies.

The parameters may include at least one of i) a position disposed between the ceiling surface and the floor surface, ii) a size of a metal panel included in each of the panel groups, and iii) an angle of a metal panel included in each of the panel groups, for the plurality of metal panels included in each of the plurality of panel groups.

In the column mode agitator, a plurality of panel groups may be disposed on a same line at a same separation distance, based on the central axis of the column mode agitator.

A plurality of panel groups may be irregularly disposed on the central axis of the column mode agitator by adjusting parameters of the plurality of metal panels included in each of the plurality of panel groups, according to natural frequencies of the plurality of panel groups and lower cut-off frequencies of the plurality of panel groups.

The wall mode agitator may include the plurality of metal panels and is spaced apart on a same line based on a central axis of the wall mode agitator from the wall of the wireless channel reproduction device.

In the wall mode agitator, parameters of each of the plurality of metal panels included in the wall mode agitator may be adjusted, considering natural frequencies by the plurality of metal panels included in the wall mode agitator and lower cut-off frequencies generatable by the natural frequencies.

Additional aspects of embodiments will be set forth in part in the description which follows and, in part, will be apparent from the description, or may be learned by practice of the disclosure.

According to embodiments, the present invention may generate a plurality of lower cut-off frequencies and thus improve performance of field uniformity or spatial uniformity, according to a test volume in the reverberation chamber.

According to embodiments, when a test volume is fixed in an reverberation chamber, a structure of the reverberation chamber may be miniaturized to be a smaller in size than a previously implemented reverberation chamber.

According to embodiments, a specific wireless channel may be implemented in an reverberation chamber, thus supporting the stability and accuracy of a device under test.

BRIEF DESCRIPTION OF THE DRAWINGS

These and/or other aspects, features, and advantages of the invention will become apparent and more readily appreciated from the following description of embodiments, taken in conjunction with the accompanying drawings of which.

DETAILED DESCRIPTION

Hereinafter, embodiments will be described in detail with reference to the accompanying drawings.

Figure 1:
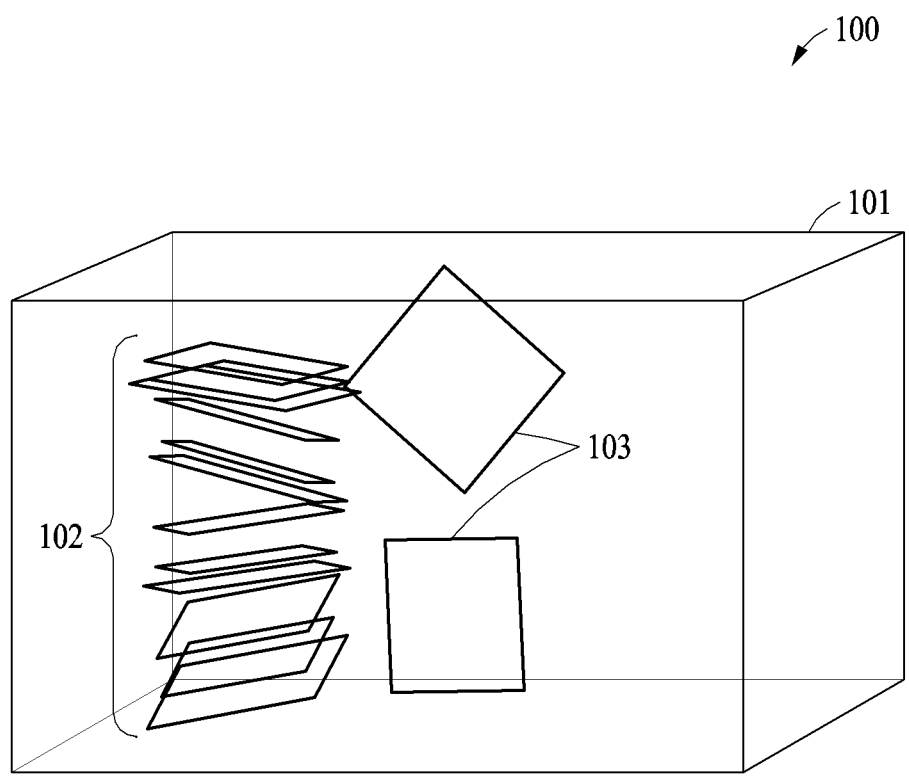
FIG. 1 is a diagram illustrating a wireless channel reproduction device having a structure of an reverberation chamber, according to an embodiment of the present invention.

FIG. 1 is a diagram illustrating a wireless channel reproduction device having a structure of an reverberation chamber, according to an embodiment of the present invention.

Referring to FIG. 1, a wireless channel reproduction device 100 may be a test device capable of reproducing a wireless channel while minimizing a measurement uncertainty according to Over-The-Air (OTA) of radio terminals. The measurement uncertainty may be a degree of uncertainty about measurement and may be an estimated value representing a range in which a true value exists. The wireless channel reproduction device 100 may provide a sudden change in the field uniformity of an reverberation chamber in a frequency band of interest.

The wireless channel reproduction device 100 may have a characteristic of spatial uniformity on a working volume according to the field uniformity of the reverberation chamber. Accordingly, the wireless channel reproduction device 100 may be designed as the internal structure of an reverberation chamber including a mode agitator. The wireless channel reproduction device 100 may implement a specific wireless channel by adjusting a mode agitator included in the reverberation chamber. The wireless channel reproduction device 100 may implement a specific wireless channel to support stability in the measurement accuracy of radio terminals.

An reverberation chamber 101 designed with the wireless channel reproduction device 100 may have a cuboid structure, and a plurality of mode agitators may be installed in the external structure of the reverberation chamber 101. The plurality of mode agitators may include a column mode agitator 102 and a wall mode agitator 103. All structures of the reverberation chamber 101 may be made of metal. In addition, the plurality of mode agitators may connect to a motor (not shown) to rotate according to a user's intention to induce a frequency band of interest. The motor may be installed on the outer wall of the reverberation chamber 101. The mode agitator and the motor may connect to each other in the following structure.

① Wall Mode Agitator

The wall mode agitator 103 may include a plurality of metal panels, and one of the plurality of metal panels may connect to a motor. A connection belt, such as a conveyor belt, may be installed at a connection portion between the motor and the metal panel. Another metal panel of the plurality of metal panels may connect to the central axis of the wall mode agitator. The motor may adjust the parameters of the wall mode agitator 103 by rotating the plurality of metal panels included in the wall mode agitator 103. For example, the wall mode agitator 103 may rotate two metal panels in the wall mode agitator 103 with one motor, thereby reducing a manufacturing cost required for installing the motor.

② Column Mode Agitator

The column mode agitator 102 may connect to a motor in the same connection structure as that of the wall mode agitator 103. Accordingly, the motor in the present disclosure may rotate the wall mode agitator 103 and the column mode agitator 102 under the same conditions.

In the present disclosure, the column mode agitator 102 and the wall mode agitator 103 may be fixed in the inner space of the reverberation chamber 101 and may connect to a metal column capable of supporting and erecting the column mode agitator 102 and the wall mode agitator 103. The metal column may connect to the central axes of the metal panels in the column mode agitator 102 and the central axes of the metal panels in the wall mode agitator 103. However, the metal column is excluded from FIG. 1 since the metal column does not significantly affect an electromagnetic simulation in the internal design of the reverberation chamber 101.

In addition, the reverberation chamber 101 may generate a plurality of lower cut-off frequencies based on the internal shape of the reverberation chamber 101, that is, the shape of the plurality of mode agitators. The reverberation chamber 101 may improve a field uniformity performance in a wider frequency band by adjusting the configuration of the plurality of mode agitators in various forms. This may allow the spatial uniformity in the reverberation chamber 101 to remain in an existing level while enlarging a test volume.

When the test volume is fixed, the size of the wireless channel reproduction device 100 may be miniaturized, thus providing a benefit of implementing a more compact product than a conventional one of the reverberation chamber 101 or application products. In addition, the reverberation chamber 101 including the plurality of mode agitators may propose a structure of the wireless channel reproduction device 100 that satisfies field uniformity standards and spatial uniformity standards, thereby providing the benefit of measuring the antenna radiation performance of various types of radio terminals, such as smartphones, more accurately than existing products.

Figure 2:
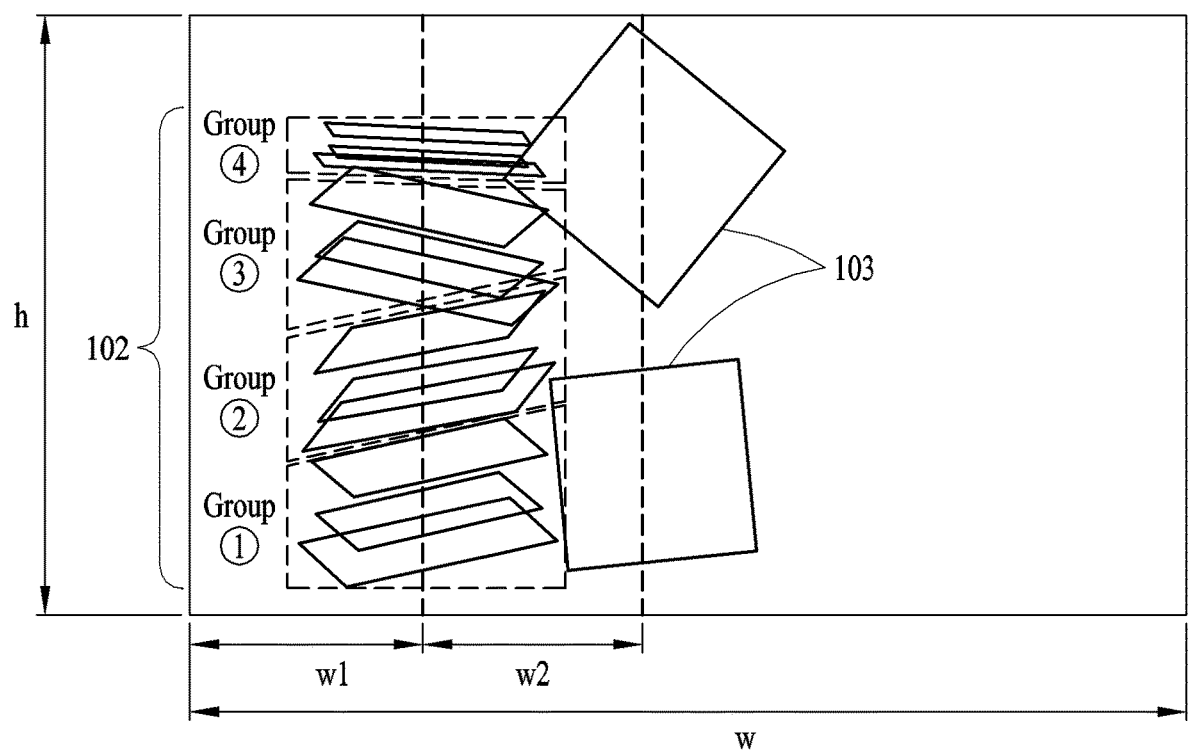
FIG. 2 is a front view of a wireless channel reproduction device according to an embodiment.

FIG. 2 is a front view of a wireless channel reproduction device according to an embodiment.

FIG. 2 may illustrate a front view among detailed cross-sectional views to provide a specific means and a method of the present disclosure. Referring to FIG. 2, the wireless channel reproduction device having a structure of an reverberation chamber may have a cuboid structure and the total size (h×w) that may be adjusted according to the miniaturization range of the wireless channel reproduction device. A plurality of mode agitators may be installed in the outer structure of an reverberation chamber 101.

Here, dashed lines shown in FIG. 2 may be dashed lines drawn to indicate a central axis 201 of a column mode agitator 102 and a central axis 202 of a wall mode agitator 103. The column mode agitator 102 may be apart by as much as a certain distance w1 from one wall of the reverberation chamber 101 to the central axis 201 of the column mode agitator 102. The wall mode agitator 103 may be apart by as much as a certain distance w2 from one wall of the reverberation chamber 101 to the central axis 202 of the wall mode agitator 103.

The plurality of mode agitators may include the column mode agitator 102 and the wall mode agitator 103. The positions of the column mode agitator 102 and the wall mode agitator 103 in the reverberation chamber 101 may be adjusted according to parameters based on the total size (h×w). The detailed configuration may be as follows.

① Column Mode Agitator

The columnar mode agitator 102 may be irregularly disposed between the ceiling surface and the floor surface in the internal space of the wireless channel reproduction device. The column mode agitator 102 may include a plurality of metal panels having different sizes. The plurality of metal panels may be formed as a plurality of panel groups for generating different lower cut-off frequencies in the wireless channel reproduction device.

More specifically, the column mode agitator 102 may include four panel groups, and each of the four panel groups may include a plurality of metal panels. Each of the four panel groups may include three metal panels. For example, the panel groups in the column mode agitator 102 may include a panel group ①, a panel group ②, a panel group ③, and a panel group ④. The panel group ① may include metal panels 1-1, 1-2, and 1-3, and the panel group ② may include metal panels 2-1, 2-2, and 2-3. In addition, the panel group ③ and the panel group ④ may be designed having a structure similar to that of the other panel groups.

A parameter of each of the panel groups of the columnar mode agitator 102 may be adjusted, considering natural frequencies of the panel groups and the lower cut-off frequencies that may be generated by the natural frequencies. Here, the parameters may include at least one of i) a position disposed between the ceiling surface and the floor surface, ii) the size of a metal panel included in each panel group, and iii) an angle of a metal panel included in each panel group. The parameters may be applied to the plurality of metal panels in each of the panel groups. The parameters applied to each of the metal panels may be different from each other. The natural frequencies of the panel groups may be different according to the parameters of the metal panels in each panel group. The lower cut-off frequencies generated according to the natural frequency of each panel group may also be different.

② Wall Mode Agitator

The wall mode agitator 103 may be apart by as much as a certain distance based on the central axis 201 of the column mode agitator 102 and disposed parallel to the wall of the wireless channel reproduction device. In the wall mode agitator 103, each metal panel may be adjusted according to the parameters and a natural frequency may be set by the adjusted metal panel. The wall mode agitator 103 may generate lower cut-off frequencies by a set natural frequencies.

For example, the wall mode agitator 103 may include two metal panels, and the structure of the two metal panels disposed in the reverberation chamber 110 may vary depending on parameters applied to each of the metal panels.

Figure 3:
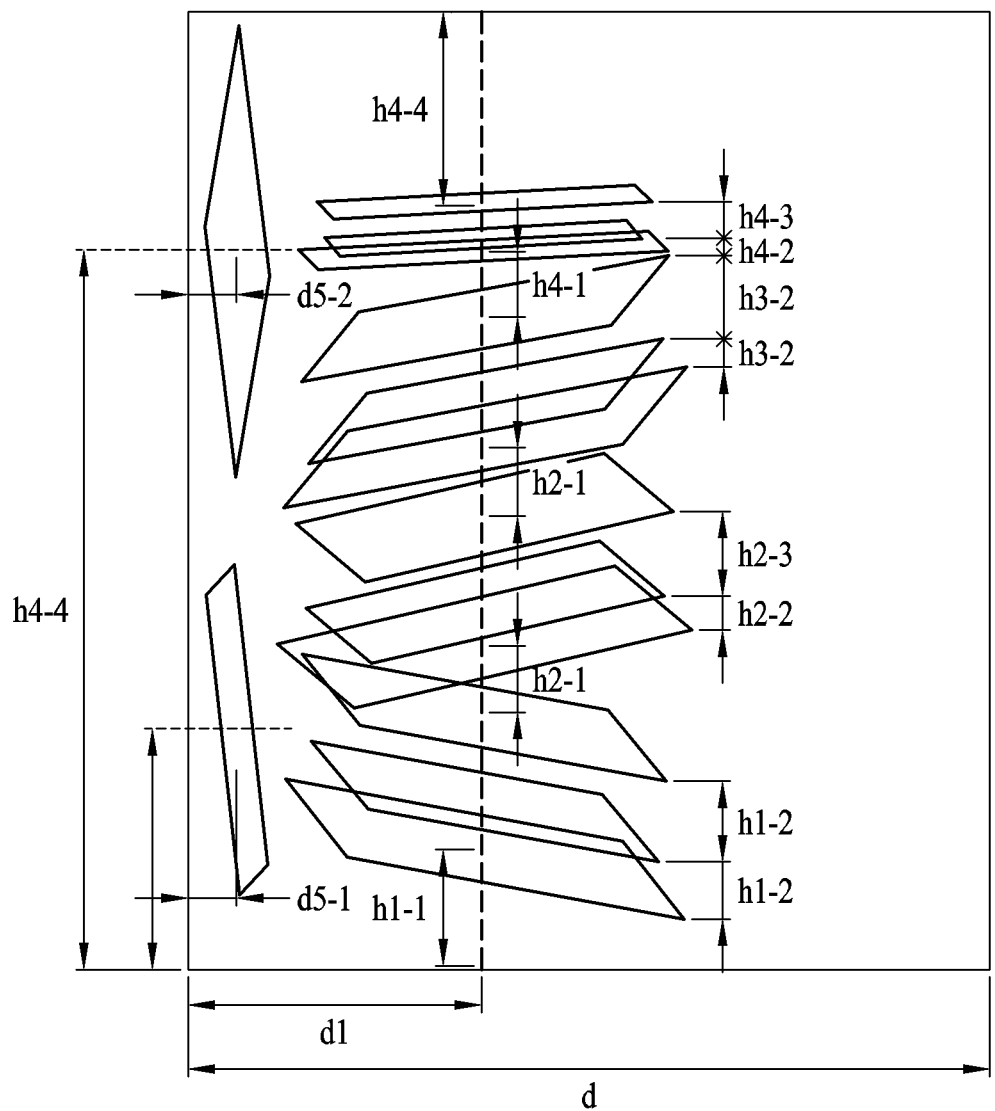
FIG. 3 is a side view of a wireless channel reproduction device according to an embodiment.

FIG. 3 is a side view of a wireless channel reproduction device according to an embodiment.

FIG. 3 may illustrate the size of the wireless channel reproduction device, parameters of mode agitators, and parameters related to the size of each of panel groups. More specifically, a column mode agitator 102 may be spaced apart by as much as a certain distance h1-1 from the bottom surface of the wireless channel reproduction device. In the column mode agitator 102, a plurality of panel groups may be arranged on the same line based on the central axis of the column mode agitator 102, at the same separation distances of h2-1, h3-1, and h4-1. Metal panels in panel groups of the column mode agitator 102 may have different parameters set according to the natural frequency set for each panel group.

For example, among metal panels included in a panel group CI, a metal panel 1-1 and a metal panel 1-2 may be spaced apart by as much as h1-2, and the metal panel 1-2 and a metal panel 1-3 may be spaced apart by as much as h1-3. A separation distance between the metal panels may be different from each other.

The wall mode agitator 103 may be spaced apart from the wall of the wireless channel reproduction device by as much as certain distances d5-1 and d5-2, and the certain distances d5-1 and d5-2 may be the same. The wall mode agitator 103 may be apart from the bottom surface of the wireless channel reproduction device by as much as certain distances h4-4 and h4-5.

Parameters related to the size of each panel group may be adjusted according to a user's intention, considering a natural frequency set for each panel group according to the frequency band of interest and a lower cut-off frequency generated from the natural frequency.

More specifically, each metal panel may change a wireless channel characteristic, such as field uniformity and spatial uniformity, according to the adjustment of parameters of a position, a size, an angle, and the like. Here, each characteristic of the field uniformity and the spatial uniformity may be a function of a frequency. A minimum frequency that satisfies the field uniformity and spatial uniformity may be designated as a lower cut-off frequency, and the lower cut-off frequency may be determined by the parameters described immediately above. The lower cut-off frequency may be an essential indicator of device performance.

Conventionally, in a general case, when a wireless channel reproduction device has a structure that satisfies two standards at a lower cut-off frequency, propagation loss according to a frequency inside the device may improve the uniformity characteristic for higher frequencies than the lower cut-off frequency, but in reality, there may be other frequency bands without improving the uniformity characteristic due to special electromagnetic coupling of the internal structure of the wireless channel reproduction device.

Therefore, the present disclosure may provide a mode agitator structure of a wireless channel reproduction device capable of generating a plurality of different lower cut-off frequencies. Each panel group in all the mode agitators may be adjusted in proportion to a wavelength (a natural frequency) corresponding to each of lower cut-off frequencies, so that each panel group may have a different lower cut-off frequency from another according to the adjustment of parameters of a shape, a position, a size, an angle, and the like.

For example, a panel group ① may be $\lambda 1$, f1, a panel group ② may be $\lambda 2$, f2, a panel group ③ may be $\lambda 3$, f3, a panel group ④ may be $\lambda 4$, f4, and a panel group ⑤ may be $\lambda 5$, f5. $\lambda$ may refer to the wavelength of each panel group, and f may indicate a lower cut-off frequency by the wavelength of each panel group.

In addition, in the case of the column mode agitator, metal panels No. 1 of each panel group may be adjusted to have a wavelength of $\lambda 1$, f1 and a lower cut-off frequency. Metal panels No. 2, metal panels No. 3, and metal panels No. 4 of each panel group may also be adjusted to have a different wavelength from each other and a lower cut-off frequency accordingly.

Since values of all parameters for the structure of the wireless channel reproduction device may be to provide information to easily tune the structure, the values of all the parameters are not limited in FIG. 3.

Figure 4:
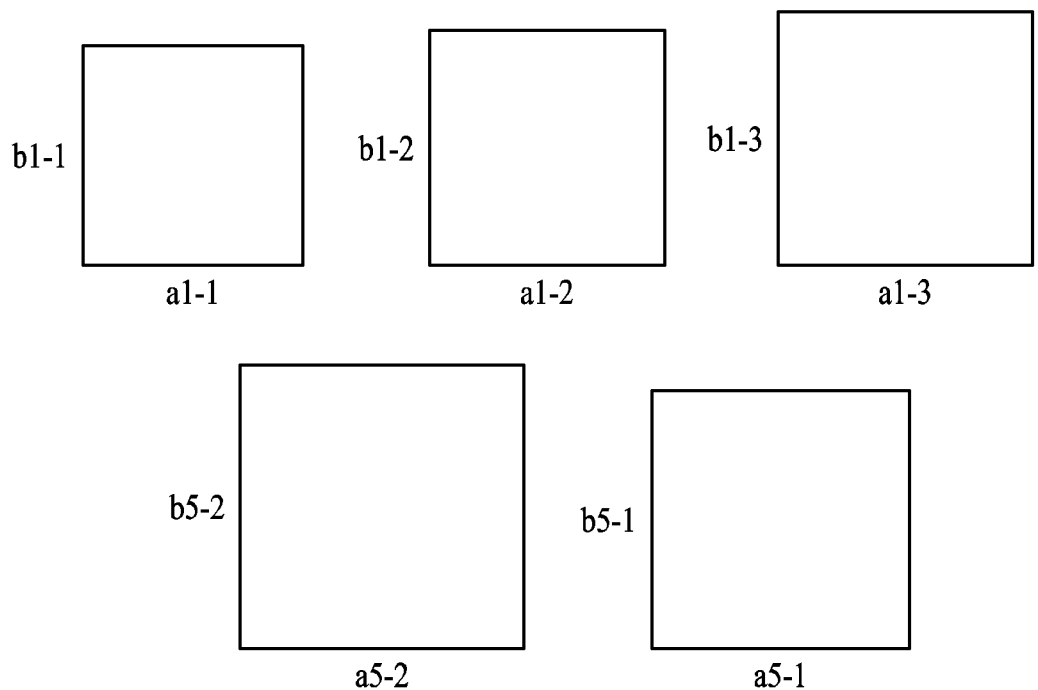
FIG. 4 is a diagram illustrating the size of a metal panel included in each panel group, according to an embodiment.

FIG. 4 is a diagram illustrating the size of a metal panel included in each panel group, according to an embodiment.

Referring to FIG. 4, each panel group may include a plurality of metal panels, and each of the plurality of metal panels may be marked with parameters having different sizes.

For example, among three panels in a panel group ①, the size of a first panel may be a1-1 and b1-1, the size of a second panel may be a1-2 and b1-2, and the size of a third panel may be a1-3 and, b1-3, in width and length, respectively. In a wall mode agitator, the size of a first panel may be indicated as a5-1 and b5-1, and the size of a second panel may be indicated as a5-2 and b5-2. In addition, some of information about a position, a size, an angle, and the like for all structures of the wireless channel reproduction device may be displayed but are omitted in FIG. 4.

Figure 5:
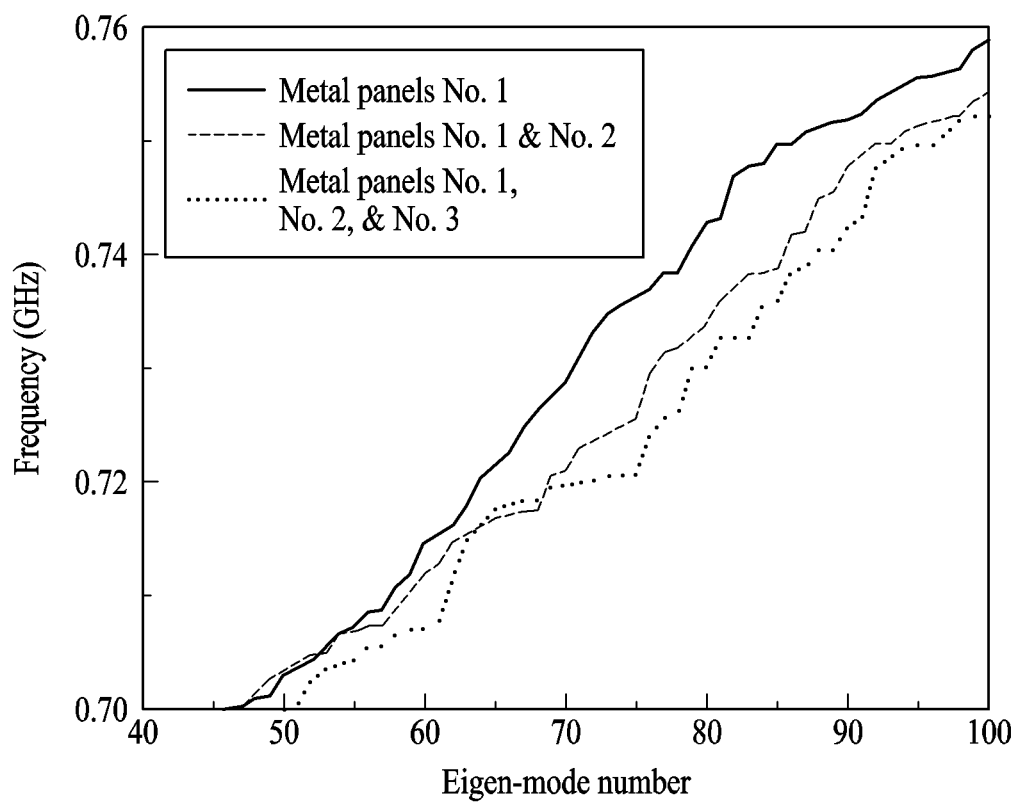
FIG. 5 is a graph illustrating a change in an Eigen-mode according to a change in a metal panel included in each panel group, according to an embodiment.

FIG. 5 is a graph illustrating a change in an Eigen-mode according to a change in a metal panel included in each panel group, according to an embodiment.

Referring to FIG. 5, a graph may represent a simulation result of electromagnetic numerical analysis to verify the effect of antenna radiation performance according to the structure of a wireless channel reproduction device. In this graph, changes in the Eigen-mode in the wireless channel reproduction device may be calculated with a function and then compared by differentiating the panel configuration of each panel group in a column mode agitator. Accordingly, each of lines may refer to as follows.

A solid line — in FIG. 5 may represent a condition of including metal panels No. 1 of each group and a condition that the column mode agitator of FIG. 2 includes only 1-1, 2-1, 3-1, and 4-1. A dashed ---- line in FIG. 5 may represent a condition of including metal panels No. 1 and No. 2 of each group and a condition that the column mode agitator of FIG. 2 includes 1-1, 1-2, 2-1, 2-2, 3-1, 3-2, 4-1, and 4-2. A dotted line ••••• in FIG. 5 may represent a condition of including all metal panels No. 1, No. 2, and No. 3 of each group.

It may be confirmed in the graph of FIG. 5 that the numerical characteristics of the Eigen-mode that determine the field uniformity and spatial uniformity of the wireless channel reproduction device may be improved according to changes in the configuration of the metal panels of each panel group. That is, since the condition represented by the dotted line . . . in FIG. 5 has more Eigen-modes in the frequency band of interest than other conditions, the two uniformity indicators in a test volume may be further improved. From this simulation example, the effect of the above idea of the present disclosure may be certainly predicted.

Figure 6:
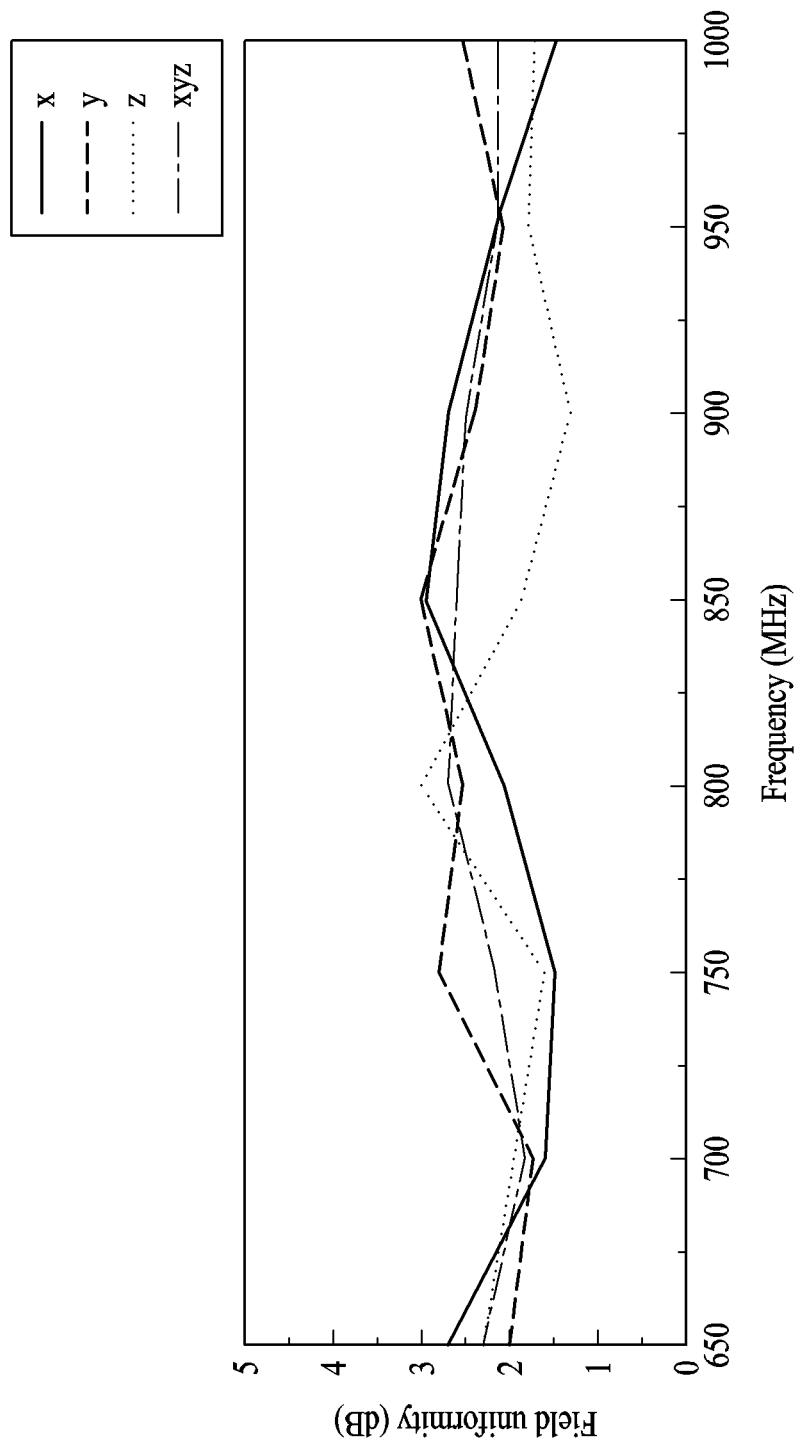
FIG. 6 is a graph illustrating field uniformity according to an embodiment.

FIG. 6 is a graph illustrating field uniformity according to an embodiment.

The graph of FIG. 6 may represent a result of simulating the field uniformity of a wireless channel reproduction device. More specifically, the graph of FIG. 6 may represent the simulation result of electromagnetic numerical analysis for the structure of an reverberation chamber of the wireless channel reproduction device. It may be confirmed that the frequency band of interest has a structure that satisfies a condition of 3 dB as a standard for the field uniformity. More specifically, the field uniformity of the wireless channel reproduction device may be expressed as a standard deviation value for electric field intensities at each vertex of a working volume. In addition, each polarization component according to the electric field at each vertex may be expressed as x, y, and z in the reverberation chamber.

Components x, y, and z, which are the total field of each of the polarization components x, y, and z in the reverberation chamber, may need to satisfy a standard condition of 3 dB for each of measurement and evaluation based on the reverberation chamber. In addition, the standard deviation of each component of the polarization components x, y, and z may be 3 dB or less.

For example, a standard specification may be a specification set by the International Electrotechnical Commission (IEC), and the wireless channel reproduction device may simulate field uniformity in the frequency band of interest so as to satisfy the standard specification according to an alternative test for electromagnetic interference and susceptibility.

Figure 7:
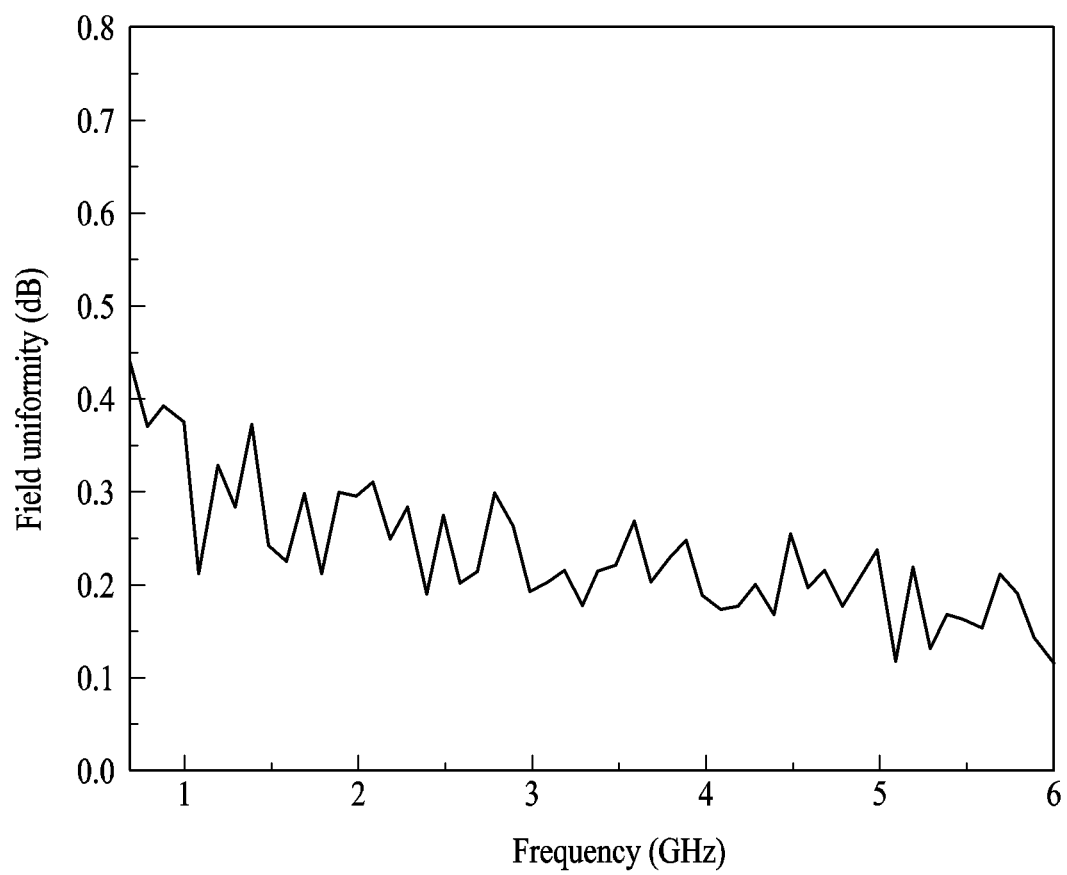
FIG. 7 is a graph illustrating spatial uniformity according to an embodiment.

FIG. 7 is a graph illustrating spatial uniformity according to an embodiment.

The graph of FIG. 7 may represent a simulation result of the spatial uniformity of a wireless channel reproduction device. More specifically, the graph of FIG. 7 may indicate a measurement result indicating whether a spatial uniformity standard is ultimately satisfied with respect to the structure of an reverberation chamber of the wireless channel reproduction device. Accordingly, it may be seen that the wireless channel reproduction device having the structure of the reverberation chamber has the spatial uniformity in a wider frequency band of interest. In an example embodiment, it may be confirmed that the wireless channel reproduction device may satisfy the standard for the spatial uniformity of the Cellular Telecommunications and Internet Association (CTIA).

The components described in the embodiments may be implemented by hardware components including, for example, at least one digital signal processor (DSP), a processor, a controller, an application-specific integrated circuit (ASIC), a programmable logic element, such as a field programmable gate array (FPGA), other electronic devices, or combinations thereof. At least some of the functions or the processes described in the embodiments may be implemented by software, and the software may be recorded on a recording medium. The components, the functions, and the processes described in the embodiments may be implemented by a combination of hardware and software.

The method according to embodiments may be written in a computer-executable program and may be implemented as various recording media such as magnetic storage media, optical reading media, or digital storage media.

Various techniques described herein may be implemented in digital electronic circuitry, computer hardware, firmware, software, or combinations thereof. The implementations may be achieved as a computer program product, i.e., a computer program tangibly embodied in an information carrier, e.g., in a machine-readable storage device (for example, a computer-readable medium) or in a propagated signal, for processing by, or to control an operation of, a data processing device, e.g., a programmable processor, a computer, or multiple computers. A computer program, such as the computer program(s) described above, may be written in any form of a programming language, including compiled or interpreted languages, and may be deployed in any form, including as a stand-alone program or as a module, a component, a subroutine, or other units suitable for use in a computing environment. A computer program may be deployed to be processed on one computer or multiple computers at one site or distributed across multiple sites and interconnected by a communication network.

Processors suitable for processing of a computer program include, by way of example, both general and special purpose microprocessors, and any one or more processors of any kind of digital computer. Generally, a processor will receive instructions and data from a read-only memory or a random-access memory, or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Examples of information carriers suitable for embodying computer program instructions and data include semiconductive wire memory devices, e.g., magnetic media such as hard disks, floppy disks, and magnetic tape, optical media such as compact disk read only memory (CD-ROM) or digital video disks (DVDs), magneto-optical media such as floptical disks, read-only memory (ROM), random-access memory (RAM), flash memory, erasable programmable ROM (EPROM), or electrically erasable programmable ROM (EEPROM). The processor and the memory may be supplemented by, or incorporated in special purpose logic circuitry.

In addition, non-transitory computer-readable media may be any available media that may be accessed by a computer and may include both computer storage media and transmission media.

Although the present specification includes details of a plurality of specific embodiments, the details should not be construed as limiting any invention or a scope that can be claimed, but rather should be construed as being descriptions of features that may be peculiar to specific embodiments of specific inventions. Specific features described in the present specification in the context of individual embodiments may be combined and implemented in a single embodiment. On the contrary, various features described in the context of a single embodiment may be implemented in a plurality of embodiments individually or in any appropriate sub-combination. Furthermore, although features may operate in a specific combination and may be initially depicted as being claimed, one or more features of a claimed combination may be excluded from the combination in some cases, and the claimed combination may be changed into a sub-combination or a modification of the sub-combination.

Likewise, although operations are depicted in a specific order in the drawings, it should not be understood that the operations must be performed in the depicted specific order or sequential order or all the shown operations must be performed in order to obtain a preferred result. In specific cases, multitasking and parallel processing may be advantageous. In addition, it should not be understood that the separation of various device components of the aforementioned embodiments is required for all the embodiments, and it should be understood that the aforementioned program components and devices may be integrated into a single software product or packaged into multiple software products.

The embodiments disclosed in the present specification and the drawings are intended merely to present specific examples in order to aid in understanding of the present disclosure but are not intended to limit the scope of the present disclosure. It will be apparent to those skilled in the art that various modifications based on the technical spirit of the present disclosure, as well as the disclosed embodiments, can be made.

What is claimed is:

1. A wireless channel reproduction device comprising:
   a column mode agitator irregularly disposed between a ceiling surface and a floor surface in an internal space of the wireless channel reproduction device; and
   a wall mode agitator spaced apart by a certain distance based on a central axis of the column mode agitator and disposed parallel to a wall of the wireless channel reproduction device,
   wherein
   the column mode agitator comprises a plurality of metal panels having different sizes, and
   the plurality of metal panels is formed as a plurality of panel groups for generating different lower cut-off frequencies from each other in the wireless channel reproduction device.

2. The wireless channel reproduction device of claim 1, wherein,
   in the column mode agitator, parameters of each of the plurality of panel groups are adjusted, considering natural frequencies of the plurality of panel groups and lower cut-off frequencies generatable by the natural frequencies.

3. The wireless channel reproduction device of claim 2, wherein the parameters comprise at least one of i) a position disposed between the ceiling surface and the floor surface, ii) a size of a metal panel comprised in each of the panel groups, and iii) an angle of a metal panel comprised in each of the panel groups, for the plurality of metal panels comprised in each of the plurality of panel groups.

4. The wireless channel reproduction device of claim 1, wherein, in the column mode agitator, the plurality of panel groups is disposed on a same line at a same separation distance, based on the central axis of the column mode agitator.

5. The wireless channel reproduction device of claim 1, wherein the plurality of panel groups is irregularly disposed on the central axis of the column mode agitator by adjusting parameters of the plurality of metal panels comprised in each of the plurality of panel groups, according to natural frequencies of the plurality of panel groups and lower cut-off frequencies of the plurality of panel groups.

6. The wireless channel reproduction device of claim 1, wherein the wall mode agitator comprises the plurality of metal panels and is spaced apart on a same line based on a central axis of the wall mode agitator from the wall of the wireless channel reproduction device.

7. The wireless channel reproduction device of claim 1, wherein, in the wall mode agitator, parameters of each of the plurality of metal panels comprised in the wall mode agitator are adjusted, considering natural frequencies by the plurality of metal panels comprised in the wall mode agitator and lower cut-off frequencies generatable by the natural frequencies.

8. A wireless channel reproduction device comprising:
   a mode agitator disposed inside the wireless channel reproduction device and comprising a plurality of metal panels;
   a motor disposed outside the wireless channel reproduction device and configured to rotate the mode agitator according to a control command of a user; and
   a conveyor belt configured to connect the mode agitator to the motor,
   wherein the mode agitator comprises:
      a column mode agitator irregularly disposed between a ceiling surface and a floor surface in an internal space of the wireless channel reproduction device; and
      a wall mode agitator spaced apart by a certain distance based on a central axis of the column mode agitator and disposed parallel to a wall of the wireless channel reproduction device.

9. The wireless channel reproduction device of claim 8, wherein, in the mode agitator, at least one of the plurality of metal panels is connected to the motor, and the motor rotates the at least one metal panel connected to the motor, using the conveyor belt.

10. The wireless channel reproduction device of claim 8, wherein
    the column mode agitator comprises a plurality of metal panels having different sizes, and
    the plurality of metal panels is formed as a plurality of panel groups for generating different lower cut-off frequencies from each other in the wireless channel reproduction device.

11. The wireless channel reproduction device of claim 8, wherein, in the column mode agitator, parameters of each of a plurality of panel groups are adjusted, considering natural frequencies of the plurality of panel groups and lower cut-off frequencies generatable by the natural frequencies.

12. The wireless channel reproduction device of claim 11, wherein the parameters comprise at least one of i) a position disposed between the ceiling surface and the floor surface, ii) a size of a metal panel comprised in each of the panel groups, and iii) an angle of a metal panel comprised in each of the panel groups, for the plurality of metal panels comprised in each of the plurality of panel groups.

13. The wireless channel reproduction device of claim 8, wherein, in the column mode agitator, a plurality of panel groups is disposed on a same line at a same separation distance, based on the central axis of the column mode agitator.

14. The wireless channel reproduction device of claim 8, wherein a plurality of panel groups is irregularly disposed on the central axis of the column mode agitator by adjusting parameters of the plurality of metal panels comprised in each of the plurality of panel groups, according to natural frequencies of the plurality of panel groups and lower cut-off frequencies of the plurality of panel groups.

15. The wireless channel reproduction device of claim 8, wherein the wall mode agitator comprises the plurality of metal panels and is spaced apart on a same line based on a central axis of the wall mode agitator from the wall of the wireless channel reproduction device.

16. The wireless channel reproduction device of claim 8, wherein, in the wall mode agitator, parameters of each of the plurality of metal panels comprised in the wall mode agitator are adjusted, considering natural frequencies by the plurality of metal panels comprised in the wall mode agitator and lower cut-off frequencies generatable by the natural frequencies.

* * * * *